United States Patent [19]

Suzuki et al.

[11] Patent Number: 4,639,285

[45] Date of Patent: Jan. 27, 1987

[54] HEAT-RESISTANT FLEXIBLE LAMINATE FOR SUBSTRATE OF PRINTED CIRCUIT BOARD AND A METHOD FOR THE PREPARATION THEREOF

[75] Inventors: Niichiro Suzuki, Tokyo; Yoshimi Ogushi, Saitama; Kiyoshi Imai, Gunma; Nobuhiro Ohta, Kanagawa; Susumu Ueno, Ibaraki, all of Japan

[73] Assignee: Shin-Etsu Chemical Co. Ltd., Tokyo, Japan

[21] Appl. No.: 826,004

[22] Filed: Feb. 4, 1986

[30] Foreign Application Priority Data

Feb. 13, 1985 [JP] Japan .................................. 60-26057

[51] Int. Cl.$^4$ ...................... B32B 31/00; B29C 17/08
[52] U.S. Cl. .................................. 156/272.6; 156/329; 156/629; 156/643; 156/646; 156/668; 156/902
[58] Field of Search .................. 156/272.2, 272.6, 329, 156/629, 630, 634, 643, 646, 668, 902; 252/79.1; 204/164, 192 EC, 192 E

[56] References Cited

U.S. PATENT DOCUMENTS

| | | | |
|---|---|---|---|
| 4,329,385 | 5/1982 | Banks et al. | 204/192 E |
| 4,396,450 | 8/1983 | Blenner et al. | 156/272.6 |
| 4,466,874 | 8/1984 | Belke et al. | 204/192 EC |
| 4,504,349 | 3/1985 | Ueno et al. | 156/272.6 |
| 4,549,921 | 10/1985 | Wolfe | 156/272.6 |

*Primary Examiner*—William A. Powell
*Attorney, Agent, or Firm*—Hopgood, Calimafde, Kalil, Blaustein & Judlowe

[57] ABSTRACT

The invention provides a flexible metal-foiled laminate of an insulating base film of a synthetic resin, e.g. polyimide, and a metal, e.g. copper, foil adhesively bonded together and suitable for use as a base plate for printed circuit boards by virtue of the high heat resistance and greatly increased adhesive bonding strength between the base film and the metal foil. The laminate is prepared by use of a silicone-based adhesive and the surface of the base film is, prior to adhesive bonding, subjected to a treatment of exposure to an atmosphere of low temperature plasma generated in a gaseous organosilicon compound such as trimethyl ethoxy silane, optionally, diluted with an inorganic gas such as oxygen.

6 Claims, No Drawings

HEAT-RESISTANT FLEXIBLE LAMINATE FOR SUBSTRATE OF PRINTED CIRCUIT BOARD AND A METHOD FOR THE PREPARATION THEREOF

BACKGROUND OF THE INVENTION

The present invention relates to a heat-resistant flexible laminate for substrate of printed circuit board and a method for the preparation thereof. More particularly, the invention relates to a flexible laminate for substrate of printed circuit board composed of a heat-resistant electrically insulating base film and a metal foil integrally bonded to the base film by use of an adhesive, of which the adhesive bonding strength between the base film and the metal foil is greatly improved.

Along with the recent trend toward more and more increased variety and compactness of electronic instruments, the electric circuitry in such an electronic instrument is increasingly provided as an assembly of printed circuit boards each prepared on a flexible laminate as a substrate composed of a base film of an electrically insulating synthetic resin and a metal foil bonded to the base and etched in a pattern of the desired electric circuit by virtue of the merit that such flexible printed circuit boards are very light in weight and can be mounted three-dimensionally in the instrument. It is of course usual that such a printed circuit board is finished by connecting various circuit elements or devices such as resistors, capacitors, coils, ICs, transistors, switch terminals and the like to the circuit pattern by soldering.

As is mentioned above, the flexible laminate for substrate of a printed circuit board is prepared by integrally bonding a base film of a synthetic resin and a metal foil by use of an adhesive. Various kinds of plastic films can be used as the flexible base film including polyethylene terephthalate films and polyimide films, of which the former films are less preferable than the latter films due to the relatively low heat resistance thereof to withstand the heat unavoidable since the circuit elements or devices must be connected to the circuit pattern by soldering. Therefore, most of the flexible foiled laminates for printed circuit boards are prepared with a polyimide film as the base in order to be resistant against heat by soldering.

The adhesive used to adhesively bond the base film of a synthetic resin and the metal foil is naturally required to have flexibility in order to ensure flexibility of the finished circuit board per se and the adhesives currently used for the purpose are exemplified by NBR-based adhesives, polyamide-based adhesives, acrylic rubber-based adhesives and the like. Another requirement for the adhesive is also the heat resistance and even the acrylic rubber-based adhesives, having the highest heat resistance among the above named ones, can hardly withstand a heating condition of 1 minute at 250° C. not to be satisfactory when the mounting works of the circuit elements or devices on to the printed circuit board includes a step of soldering. For example, difficulties are frequently encountered in the repair works of the printed circuit board because of the poor heat resistance of the adhesive not to withstand heating for a sufficient length of time required for the repair works by soldering. Furthermore, the printed circuit boards are not rarely used at an elevated temperature so that high heat resistance is essential even by setting aside the problems in the repair works with soldering.

A possibility of obtaining high heat resistance of a printed circuit board may be provided by use of a silicone- or organopolysiloxane-based adhesive including so-called silicone resin and silicone rubber adhesives known generally to have good heat resistance in comparison with ordinary organic adhesives. A problem in the use of silicone-based adhesives is their relatively low adhesiveness so that a sufficiently high adhesive bonding strength can be obtained only by subjecting the base film to a pretreatment of surface modification such as priming prior to the adhesive bonding of a metal foil thereto. Despite such a troublesome pretreatment, no practically usable flexible laminate for printed circuit boards has yet been obtained.

SUMMARY OF THE INVENTION

An object of the present invention is therefore to provide a highly heat-resistant flexible laminate for a substrate of printed circuit boards composed of a base film of an electrically insulating synthetic resin and a metal foil integrally bonded together by use of an adhesive and a method for the preparation thereof.

Thus, the flexible foiled laminate of the invention for substrate of printed circuit board is prepared by a method which comprises the steps of:

(a) subjecting at least one surface of a base film of a synthetic resin to exposure to low temperature plasma generated in a gaseous atmosphere of an organosilicon compound; and (b) adhesively bonding a metal foil to the surface of the base film exposed to the low temperature plasma by use of a silicone-based adhesive intervening therebetween.

The above described method of the invention is so effective that the flexible laminate prepared thereby has a greatly improved heat resistance and flame retardncy as well as excellent mechanical strengths. In addition, the adhesive bonding strength between the base film and the metal foil can also be greatly improved when the adhesive is a self-bonding silicone rubber adhesive.

DETAILED DESCRIPTION OF THE PREFERRED EMBODIMENTS

The flexible base film of a synthetic resin used in the inventive method should be electrically insulating and highly heat-resistant. In this regard, suitable synthetic resins as the film material are exemplified by polyimides, polyphenylene sulfides, polyparabanates, heat-resistant polyesters, polyether sulfones, polyether ether ketones and the like. The thickness of the base film is not particularly limitative but it is usually in the range from about 0.012 to about 0.135 mm. The metal foil to be adhesively bonded to the base film is a copper or aluminum foil and electrolytic and rolled copper foils are preferred.

Prior to adhesively bonding the above mentioned base film and the metal foil by use of a silicone-based adhesive, it is essential that the surface of the base film, to which the metal foil is adhesively bonded, is subjected to exposure to low temperature plasma generated in a gaseous atmosphere of an organosilicon compound. The method for the low temperature plasma treatment is well known in the art. For example, the base film of a synthetic resin is placed in a plasma chamber of an apparatus for generation of low temperature plasma which is generated by impressing a direct-current or alternate-current electric voltage of 0.1 to 5 kV between the electrodes of the apparatus to cause glow discharge inside the plasma chamber while the atmosphere inside the chamber is kept under a reduced pressure of 0.001 to 10 Torr or, preferably, 0.01 to 1 Torr under a continuous flow of a specified gas. It is an efficient way that the plasma chamber has such a mechanism and structure that the base film in a continuous length can be run continuously through the atmosphere of the low temperature plasma The length of time for the low temperature plasma treatment is usually in the range from about 10 seconds to about 100 seconds although the length should be controlled in consideration of the intensity of the plasma discharge and several other parameters.

It is essential in the invention that the gas filling the atmosphere of the low temperature plasma to support the plasma discharge is of an organosilicon compound. Suitable organosilicon compounds in this case include organosilane compounds, e.g. tetramethyl silane, trimethyl ethoxy silane, dimethyl dimethoxy silane and vinyl triethoxy silane, organopolysiloxane compounds, e.g. hexamethyl disiloxane, organodisilane compounds, e.g. hexamethyl disilane, organopolysilazane compounds, e.g. hexamethyl disilazane and others. The organosilicon compound should have a boiling point of, preferably, 150° C. or below under normal pressure. It is optional that the gaseous atmosphere of the low temperature plasma is formed of a mixture of the above mentioned organosilicon compound with one or more of inorganic gases. Such an inorganic mixing gas is exemplified by helium, neon, argon, oxygen, nitrogen, carbon monoxide, carbon dioxide, ammonia, air and the like. In particular, oxygen gas is preferable as the inorganic mixing or diluent gas of the organosilicon compound in respect of the higher efficiency in the improvement of the adhesiveness of the plasma-treated base film surface. Quite satisfactory results can be obtained when the mixing ratio of the organosilicon compound and the inorganic gas, e.g. oxygen, is in the range from 20:80 to 95:5 by volume.

The silicone-based adhesive used for adhesively bonding the thus plasma-treated base film and the metal foil may be in the form of a viscous fluid or a solid dissolved in an organic solvent to have an adequate consistency suitable for uniformly coating the surface of the plasma-treated base film or the metal foil, desirably, in a continuous process. The adhesive preferably should have flexibility after adhesively bonding the base film and the metal foil and should be capable of exhibiting a sufficiently high adhesive bonding strength by heating the laminated base film and the metal foil at a temperature of 100° to 200° C. for a few seconds to several tens of minutes. Various kinds of silicone products are available to meet the above mentioned requirements including liquid or pasty silicone rubbers curable at room temperature or, even if heating is required, at a relatively low temperature and sometimes called a RTV or LTV silicone rubber and self-bonding silicone rubbers sold on the market as a hot-air vulcanizable silicone rubber. Certain types of silicone resin-based adhesives can also be used. They are used as diluted with an organic solvent according to need to have an adequate consistency suitable for the coating works. Organic solvents suitable for dilution of these silicone-based adhesives are exemplified by acetone, toluene, methyl ethyl ketone, ethylene glycol monomethyl ether, tetrahydrofuran, dimethyl formamide, dioxane and the like.

Following description under (i) to (iii) illustrates particular procedures for the preparation of the flexible foiled laminate for printed circuit board according to the invention.

(i) At least one of the surfaces of the base film is subjected to the treatment with low temperature plasma of the organosilicon compound and the plasma-treated surface is coated with a layer of the silicone-based adhesive to which the metal foil is directly contacted and pressed together at room temperature or at an elevated temperature so as to cure the adhesive.

(ii) One of the surfaces of the metal foil is coated with the silicone-based adhesive and the base film is laid thereon with the plasma-treated surface in contact with the metal foil and pressed together at room temperature or at an elevated temperature to cure the adhesive.

(iii) Both of the plasma-treated surface of the base film and the surface of the metal foil are coated with the silicone-based adhesive and they are laid one on the other to have the adhesive-coated surfaces in direct contact with each other followed by pressing together at room temperature or at an elevated temperature. It is of course optional that the surfaces of the plasma-treated base film and the metal foil are coated with different kinds of adhesives according to need.

The procedure of (i) given above is described below in further detail. Thus, the plasma-treated surface of the base film is coated in a coater-dryer with a silicone-based adhesive composition, e.g. a silicone rubber composition, optionally, diluted with an organic solvent to give a coating thickness after drying of about 0.010 to about 0.150 mm followed by heating at a temperature up to 120° C. for about 0.5 to 20 minutes to remove any volatile matter from the adhesive composition. The metal foil, e.g. copper or aluminum foil, is laid on the surface of the base film provided with the layer of the adhesive and pressed together between hot plates of a press or by passing through a hot roller to cure the adhesive. If necessary, a post-cure treatment of the thus obtained foiled laminate may be undertaken. The press-bonding is performed preferably under conditions of a temperature of 40° to 170° C., a pressure of 1 to 100 kgf/cm$^2$ and a length of time of 0.2 second to 60 minutes though dependent on the type of the adhesive. The post-cure treatment is performed usually at a temperature of 50° to 200° C. for 1 to 30 hours and the rate of temperature elevation should be sufficiently low up to the above mentioned temperature.

Besides the principal advantage of the invention to provide a highly heat-resistant flexible laminate, an additional advantage in the flexible laminate prepared according to the invention is the excellent flame retardancy thereof by virtue of the flame retardancy of silicone-based adhesives in general. The flame retardancy can be further increased by admixing the silicone-based adhesive with some flame-retardant agents such as powdery non-flammable inorganic materials, e.g. silicon dioxide and titanium dioxide, bromine-containing organic compounds, combinations of a phenolic compound and antimony trioxide, and others.

In the following, the present invention is illustrated in more detail by way of examples.

EXAMPLE 1

A 25 cm by 25 cm square polyimide film of 0.025 mm thickness was placed in the plasma chamber of an apparatus for generation of low temperature plasma and, after evacuation of the chamber, vapor of trimethyl ethoxy silane was continuously introduced thereinto to keep the pressure inside the chamber at 0.1 Torr by the balance of the continuous evacuation and vapor introduction. While maintaining the atmospheric condition inside the chamber as mentioned above, a high frequency electric voltage of 2.5 kV at a frequency of 110 kHz was impressed between the electrodes installed inside the chamber to effect glow discharge and the surface of the polyimide film was exposed for 60 seconds to the thus generated low temperature plasma. The polyimide film was put on the lower electrode facing the upper electrode above in parallel with the lower at a distance of 12 cm.

The thus plasma-treated polyimide film was coated with a solution of a silicone rubber-based adhesive (KE 1212, a trade name) sold by Shin-Etsu Chemical Co., Japan, in a coating thickness after drying of 0.025 mm followed by heating at 80° C. for 5 minutes to evaporate the solvent and to bring the adhesive composition into a semi-cured state. An electrolytic copper foil of 25 cm by 25 cm wide and 0.035 mm thick was laid on the surface of the polyimide film provided with the adhesive layer and pressed together by passing through a hot roller at 170° C. under a pressure of 5 kgf/cm² to cure the silicone adhesive. The thus obtained laminate was subjected to a post-cure treatment by increasing the temperature at a rate of 20° C. per hour up to 150° C. where it was kept for 1 hour.

Several flexible laminates were prepared in substantially the same manner as described above except that the gas introduced into the plasma chamber was a mixture of an organosilicon compound and oxygen or argon in a specified volume proportion instead of trimethyl ethoxy silane alone. For comparison, vapors of methyl acrylte and methacrylic acid were used as the plasma-supporting gas in place of the organosilicon compound or a mixture thereof with an inorganic gas. For further comparison, a similar flexible laminate was prepared by use of a polyimide film before the low temperature plasma treatment.

These flexible laminates were subjected to the test of the peeling resistance between the polyimide base film and the copper foil to give results in kgf/cm shown in Table 1 below together with the composition of the gaseous atmosphere supporting the plasma discharge. Further, the laminates were subjected to the test of heat resistance by soldering at 300° C. to find that all of the laminates could withstand heating for 1 minute or longer excepting the comparative laminate prepared of the polyimide film before the plasma treatment on which blistering was noted after heating in the same conditions. Still further, the laminates were subjected to the test of solvent resistance by dipping at 25° C. for 5 minutes in methyl alcohol, acetone or methylene chloride to find that no noticeable changes were found in all of the laminates irrespective of the kind of the solvent excepting the comparative laminate prepared without the low temperature plasma treatment of which peeling was noted more or less between the polyimide base film and the copper foil. All of the laminates could satisfy the flame-retardancy standard of UL-94-V-0.

TABLE 1

| Plasma-supporting gases | | | Peeling |
|---|---|---|---|
| Organosilicon compound | Inorganic gas | Ratio by volume | resistance, kgf/cm |
| Trimethyl ethoxy silane | None | — | 1.3 |
| Trimethyl ethoxy silane | Oxygen | 90:10 | 1.8 |
| Trimethyl ethoxy silane | Oxygen | 80:20 | 2.5 |
| Trimethyl ethoxy silane | Argon | 80:20 | 2.3 |
| Trimethyl ethoxy silane | Oxygen | 70:30 | 2.2 |
| Trimethyl ethoxy silane | Oxygen | 60:40 | 1.9 |
| Tetramethyl silane | Oxygen | 70:30 | 2.4 |

TABLE 1-continued

| Plasma-supporting gases | | | Peeling |
|---|---|---|---|
| Organosilicon compound | Inorganic gas | Ratio by volume | resistance, kgf/cm |
| Hexamethyl disilane | Oxygen | 70:30 | 2.4 |
| Hexamethyl disiloxane | Oxygen | 80:20 | 2.5 |
| Hexamethyl disilazane | Oxygen | 70:30 | 2.2 |
| (Methyl acrylate) | None | — | 1.0 |
| (Methacrylic acid) | None | — | 0.9 |
| (No plasma treatment) | | | 0.2 |

EXAMPLE 2

The same polyimide film as used in Example 1 was subjected to a low temperature plasma treatment in the same manner as in Example 1 except that the plasma-supporting gas was a 85:15 by volume mixture of trimethyl ethoxy silane and oxygen at a pressure of 0.05 Torr, the voltage impressed between the electrodes was 3 kV and the length of time for the treatment was 45 seconds.

The thus plasma-treated polyimide film was laminated with an oxygenless rolled copper foil of 0.035 mm thickness prepared by rolling in an atmosphere containing 0.001% or less of oxygen. Thus, the copper foil was coated with one of the 4 kinds of silicone-based adhesive compositions A to D shown below in a coating thickness of 0.025 mm after drying by use of a test coating machine equipped with a reverse coater followed by heating for 5 minutes at 80° C. so that the adhesive composition became dried and semi-cured. In each of the following formulations of the adhesive compositions, the base ingredient was a self-bonding type silicone rubber composition manufactured by Shin-Etsu Chemical Co., Japan, and indicated by a name of the grade beginning with a symbol of KE as combined, when necessary, with a curing catalyst of Catalyst RC or Catalyst C-3 recommended by the manufacturer. The expression of "parts" hereinbelow refers to "parts by weight" in each occurrence.

| Adhesive Composition A: | KE 68SB | 100 parts |
|---|---|---|
| | Catalyst RC | 3 parts |
| | toluene | 100 parts |
| Adhesive composition B: | KE 1800A | 100 parts |
| | KE 1800B | 10 parts |
| | KE 1800C | 2 parts |
| | toluene | 100 parts |
| Adhesive composition C: | KE 1251 as supplied | |
| Adhesive composition D: | KE 701Bu | 100 parts |
| | Catalyst C-3 | 3 parts |
| | toluene | 200 parts |

The plasma-treated polyimide film and the copper foil thus provided with a semi-cured adhesive layer were laid one on the other and press-bonded by passing through a roller at 170° C. under a pressure of 5 kgf/cm² and then subjected to a post-cure treatment at 150° C. for 1 hour to give a copper-foiled laminate suitable for use as a base plate of printed circuit boards. The thus prepared foiled laminates were subjected to the test of the peeling resistance in the same manner as in Example 1 to give values of 2, 0, 2.4, 2.3 and 2.3 kgf/cm for the adhesive compositions A, B, C and D, respectively. All of the laminates could withstand the heating test by soldering at 260° C. for 1 minute and could pass the test of solvent resistance carried out in the same manner as in Example 1.

EXAMPLE 3

The base film was the same polyimide film as used in the preceding examples but in a rolled form of 508 mm width and 50 meters length. The film was run continuously at a velocity of 60 meters/minute through the atmosphere of low temperature plasma generated in an apparatus for continuous plasma treatment. The plasma chamber had 4 rod electrodes for power input diagonally disposed in parallel with each other and the polyimide film was run therearound keeping a distance of 4 cm from the surface of the electrodes through the space between the input electrodes and the surrounding inner walls of the chamber as the grounded electrode. The atmosphere in the plasma chamber of the apparatus was kept under a pressure of 0.5 Torr by the balance of continuous evacuation and introduction of a 80:20 by volume gaseous mixture of hexamethyl disilane and oxygen at a rate of 1 liter/minute. The electric power impressed between the electrodes was 20 kilowatts at a voltage of 2 kV and a frequency of 110 kHz.

The thus plasma-treated polyimide film and a rolled copper foil were continuously processed into a laminate by roller-pressing in a continuous laminating machine by use of an adhesive composition prepared by dissolving 100 parts of KE 1800A, 10 parts of KE 1800B and 2 parts of KE 1800C (see Example 2) in 50 parts of toluene. The surfaces of both of the polyimide film and the copper foil were coated with the adhesive composition and heated prior to press-bonding to be dried and semi-cured. The coating amount of the adhesive composition was controlled so as to have an overall thickness of 0.025 mm as a total of the adhesive layers on the polyimide film and copper foil.

The thus prepared copper-foiled laminate was rolled around a mandrel and subjected to a post-cure treatment by keeping in a hot-air circulation oven at 150° C. for 1 hour followed by standing to be cooled. Several test specimens were taken from the rolled laminate and subjected to the tests of peeling resistance, heat resistance by soldering and solvent resistance carried out in the same manner as in the preceding examples to give results of 2.5 kgf/cm, 1 minute or longer at 300° C. and good stability in methyl alcohol, acetone and methylene chloride, respectively.

What is claimed is:

1. A method for the preparation of a metal-foiled flexible laminate formed of a flexible base film of an electrically insulating synthetic resin and a metal foil adhesively bonded to the base film and suitable for use as a substrate of printed circuit board which comprises the steps of:
   (a) subjecting at least one surface of a base film of a synthetic resin to exposure to low temperature plasma generated in an atmosphere of an organosilicon compound in a gaseous form under a pressure in the range from 0.001 to 10 Torr; and
   (b) adhesively bonding a metal foil to the surface of the base film exposed to the low temperature plasma by use of a silicone-based adhesive intervening therebetween.

2. The method as claimed in claim 1 wherein the pressure of the atmosphere of low temperature plasma is in the range from 0.01 to 1 Torr.

3. The method as claimed in claim 1 wherein the organosilicon compound in a gaseous form is diluted with an inorganic gas.

4. The method as claimed in claim 3 wherein the volume ratio of the organosilicon compound in a gaseous form and the inorganic gas is in the range from 20:80 to 95:5.

5. The method as claimed in claim 3 wherein the inorganic gas is oxygen or argon.

6. The method as claimed in claim 1 wherein the organosilicon compound is selected from the group consisting of organosilanes, organopolysiloxanes, organodisilanes and organodisilazanes.

* * * * *